United States Patent [19]

Sivan et al.

[11] Patent Number: 4,942,137
[45] Date of Patent: Jul. 17, 1990

[54] SELF-ALIGNED TRENCH WITH SELECTIVE TRENCH FILL

[75] Inventors: Richard D. Sivan; James R. Pfiester; John E. Leiss, all of Austin, Tex.

[73] Assignee: Motorola, Inc., Schaumburg, Ill.

[21] Appl. No.: 393,210

[22] Filed: Aug. 14, 1989

[51] Int. Cl.$^5$ .............................................. H01L 21/76
[52] U.S. Cl. ........................................ 437/63; 437/67; 437/73; 437/72
[58] Field of Search ................ 437/72, 67, 78, 79, 437/63

[56] References Cited

U.S. PATENT DOCUMENTS

| | | | |
|---|---|---|---|
| 4,473,598 | 9/1984 | Ephrath et al. | 437/80 |
| 4,679,304 | 7/1987 | Bois | 437/67 |
| 4,830,978 | 5/1989 | Teng et al. | 437/52 |
| 4,847,214 | 7/1989 | Robb et al. | 437/67 |

OTHER PUBLICATIONS

Advanced OSELCO Isolation with Shallow Grooves for Three-Quarter Micron ULSI's, T. Kaga, et al, Extended Abstracts 18th Conf. on Solid St Devices & Materials, pp. 61-64, Tokyo, Japan, Sep. '86.

Primary Examiner—Olik Chaudhuri
Attorney, Agent, or Firm—Jasper W. Dockrey; James L. Clingan, Jr.

[57] ABSTRACT

A method for fabricating a self-aligned trench structure in a semiconductor device is disclosed. In accordance with one method for fabricating the trench structure, an oxidation resistant material having an opening is used as a masking layer. The edge of the opening in the masking layer is covered by a sidewall spacer which protects a portion of the substrate from attack by the etchant used to form the trench. The trench is filled with a trench fill material by selective deposition using a seeding material formed on the sidewall of the trench as a nucleation site. After the trench is filled, the sidewall spacer is removed and the underlying substrate is oxidized to form an electrical insulation region around the upper portion of the trench. The mask layer is removed and the remaining substrate is doped using the insulation region surrounding the trench as a dopant mask.

19 Claims, 3 Drawing Sheets

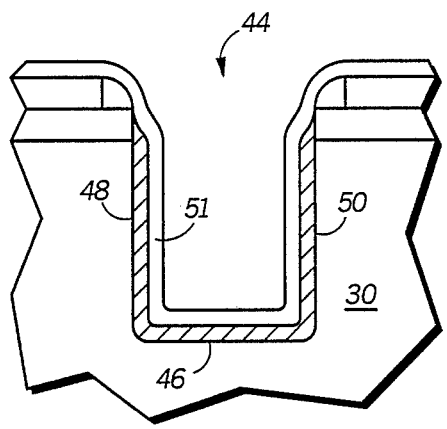
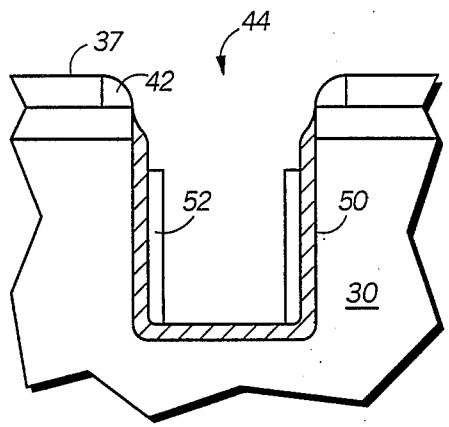
*FIG.5*  *FIG.6*
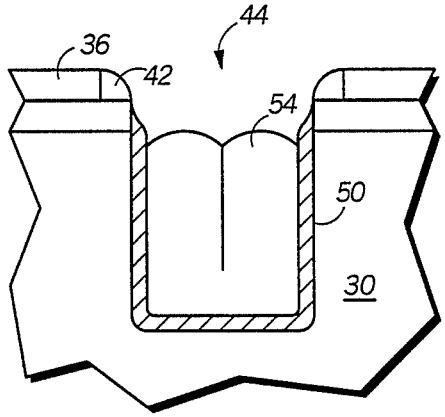
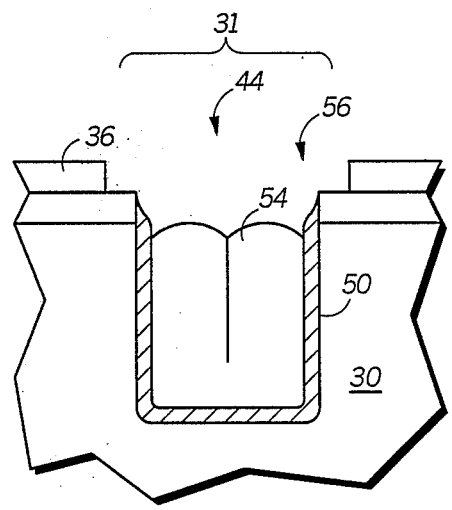
*FIG.7*  *FIG.8*

SELF-ALIGNED TRENCH WITH SELECTIVE TRENCH FILL

BACKGROUND OF THE INVENTION

This invention relates generally to semiconductor devices, and more specifically to a process for the formation of trench structures in a semiconductor integrated circuit.

The trend in semiconductor device fabrication towards increasing density of circuit components requires that ever smaller areas of the circuit be devoted to isolation of the circuit components and capacitive storage devices. The need to reduce the surface area used for circuit components such as isolation structures and large area capacitor devices has resulted in the development of structures vertically oriented with respect to the plane of the substrate surface. These vertical structures typically consist of some type of trench structure sunk into the semiconductor substrate, usually 3 to 5 microns deep, and are positioned intermediate to charge carrying components of adjacent transistors. The utilization of a trench structure enables the formation of a structure having a large volume while minimizing the amount of surface area consumed. The creation of a vertically oriented structure achieves the goal of minimal consumption of surface area, however, the vertical geometry does not by itself provide adequate electrical isolation from surrounding circuit components.

Metal-oxide-semiconductor (MOS), very large scale integration (VLSI) design requirements often require placement of a variety of circuit components in close proximity to each other. In certain cases these components must function independently of each other. Trench isolation structures, used to electrically isolate adjacent transistors, and large area trench capacitors used to store electrical charge must be fabricated in such a way as to minimize transistor performance degradation. The fabrication of a trench structure, in such a dynamic electrical environment, requires special techniques to minimize the formation of current leakage paths. Current leakage between source and drain regions of an adjacent transistor can occur in the area where the trench interfaces with the transistor gate. An additional problem is that of parasitic capacitor formation of the trench structure with highly doped source and drain regions of adjacent transistors.

In the case of an isolation trench, electrical isolation to at least the supply voltage, (commonly 5 volts), must be provided between integrated circuit components such as the source and the drain regions within a transistor, and between the source and drain regions of adjacent transistors. Typically an electrical isolation value of greater than twice the supply voltage is required to guarantee proper device performance. The main isolation related causes of transistor performance degradation are: subthreshold current leakage along the sidewall of the isolation trench near the transistor gate electrode; capacitive coupling between the source and drain regions and the isolation structure; and, the formation of a parasitic transistor after polycrystalline silicon (polysilicon) gate interconnects are formed which overlay the isolation structure. Each of these causes of transistor performance degradation must be addressed in order to fabricate a fully functional trench isolation structure.

FIG. 1 illustrates, in cross section, a trench structure according to the prior art showing the trench structure positioned in the substrate intermediate to two charge carrying elements. The elements shown in FIG. 1 comprise typical components of a portion of an integrated circuit structure. As noted above, an isolation trench is commonly used to provide electrical isolation between the source and drain regions of an MOS field effect transistor. A trench capacitor, for application in a DRAM cell, is often located in a similar substrate region. The trench is formed in an isolation region 11 of a semiconductor substrate 10. An insulation layer 14 overlies the surface of the substrate and a passivation layer 16 lines the walls of the trench. Using techniques well known in the art for a DRAM capacitor application, the trench is filled with a deposited conductive material 18, usually polysilicon, which is then etched back to form a continuous surface with insulation layer 14. In the case of an isolation structure, the trench can be filled with a dielectric material, such as silicon dioxide, as an alternative to a conductive material. During the etch back of excess fill material, as often occurs in this process, the etchant preferentially attacks material 18 along seam 20 yielding a surface similar to that shown in FIG. 1. The seam 20 and the depressed surface 22 are morphological characteristics resulting from the prior art processes used to deposit material 18 into trench 12 and etch back excess material. The presence of this depression can result in poor step coverage when a polysilicon gate interconnect overlying surface 22 is formed. The rough surface topography created by the surface depression can also result in an incomplete removal of the polysilicon during etching to form the gate interconnects. The unetched polysilicon remaining in the depression can provide an unwanted conductive channel between adjacent interconnects.

The semiconductor substrate 10 is subsequently processed to form source and drain regions 24 and 26 in substrate 10. The source and drain regions 24 and 26 consist of highly doped regions of substrate 10 which are usually created by ion implantation of an N or P type dopant atom such as phosphorus or boron. To adequately insulate transistor elements from each other, a means must be provided to further electrically isolate elements 24 and 26 from each other and from conductive material 18.

In the application of trench isolation structures to address electrical isolation requirements of adjacent transistors, and between source/drain regions of a single transistor, several problems must be solved. The most serious is sidewall channel current leakage long the gate of the transistor, i.e. into the plane of FIG. 1. A further problem is associated with the presence of a parasitic capacitor in which non-related source/drain regions 24 and 26 are capacitively coupled by extension of the depletion layers surrounding the source/drain regions in close proximity with trench 12. An additional problem occurs when a polysilicon gate interconnect is formed overlying surface 22. A parasitic transistor arises from the relative position of the source/drain region of adjacent transistors and the polysilicon interconnect over the trench isolation region 11. This problem is further compounded by forming the interconnect over an uneven surface caused by the fill and etch back technique previously described.

A number of methods have been used to address these problems. One technique is to first form an isolation region of thick silicon dioxide, normally to a thickness of about 800 nanometers, using a conventional localized oxidation of silicon (LOCOS) process. A mask having a trench pattern is then critically aligned to the previously formed isolation region in order to form a trench in a central portion of the isolation region. The formation of a trench in a region of thick silicon dioxide provides a passivation collar around the perimeter of the upper portion of the trench. A commonly encountered problem when using this method is that the trench is mis-aligned in the isolation region such that the edge of the trench lies in close proximity to a source/drain region. The mis-alignment then defeats the insulation benefits of the passivation collar.

The fabrication of a trench structure having adequate electrical isolation characteristics becomes increasingly important as available chip surface area, that can be devoted to isolation, diminishes. Previous fabrication methods have not totally addressed the problems associated with parasitic device action and topographical discontinuity. Accordingly, a need exists for a trench structure that is self aligned to the isolation region in a semiconductor substrate such that an isolation region of uniform dimension can be provided around the perimeter of the trench. A further need exists for a trench structure having a smooth surface topography that will allow a transistor interconnect to be evenly overlaid.

BRIEF SUMMARY OF THE INVENTION

An object of the present invention is to provide an improved trench structure for use in a semiconductor device.

Another object of the present invention is to provide an improved trench structure that is self aligned to the non-active region of a semiconductor substrate.

It is yet another object of the present invention to provide an improved trench structure having a smooth surface topography in a semiconductor device.

The forgoing and other objects of the invention are achieved, in one embodiment, by a method for the fabrication of a trench structure having a surface of low topographical contrast and one that is self-aligned to the non-active region of a semiconductor substrate. In accordance with that embodiment of the invention, a semiconductor substrate is provided having an active region and a non-active region. A masking layer of oxidation resistant material is formed overlying the substrate and an opening is formed in the masking layer exposing a portion of the underlying substrate in the non-active region. A sidewall spacer is formed on the wall of the opening in the masking layer and a trench is etched into the substrate using the sidewall spacer as a mask. A passivation layer is formed overlying the surface of the trench and the trench is filled with a conformal material. The sidewall spacers are removed, exposing a portion of the substrate near the edge of the opening defined by the masking layer. The exposed portion of the substrate is oxidized forming an electrical insulation region around the top portion of the trench. The masking layer is then removed to expose an active region of the substrate.

BRIEF DESCRIPTION OF THE DRAWINGS

FIGS. 2-10 illustrate, in cross section, process steps in accordance with a preferred embodiment of the invention.

DETAILED DESCRIPTION OF THE PREFERRED EMBODIMENTS

FIGS. 2-10 illustrate, in cross section, process steps in accordance with one embodiment of the invention whereby a trench structure is formed having electrical isolation from associated and adjacent source/drain regions, and which is self aligned to the substrate regions in which the source/drain regions are formed. Such a structure could be used, for example, in an SRAM, a DRAM, or other integrated circuit structure where a high packing density of transistors is required.

Figure 1:
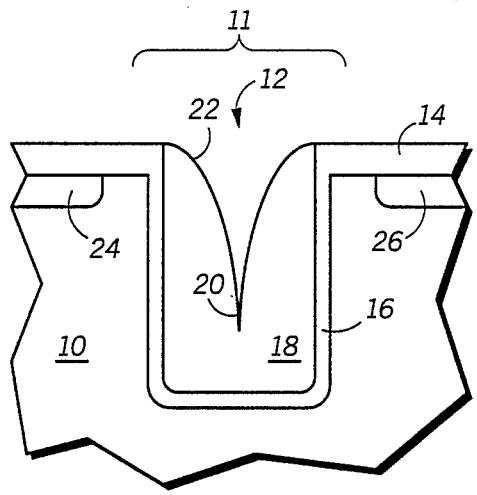
FIG. 1 illustrates, in cross section, a trench structure in accordance with the prior art.
Figure 2:
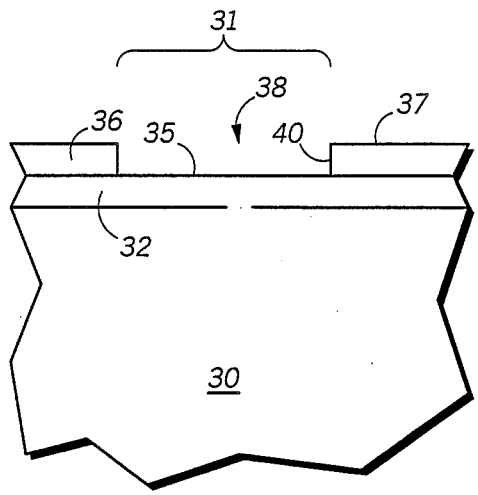

FIG. 2 illustrates, in cross section, a portion of a semiconductor substrate which has already undergone some of the processing steps used in the fabrication of an integrated circuit in accordance with the invention. The portion of the structure illustrated includes a semiconductor substrate 30, having a non-active region 31 separating active regions on either side, and an insulating layer 32 formed thereon. Insulating layer 32 has a top surface 35. This insulating layer, which may be thermal silicon dioxide or the like, is used to protect substrate 30 from the effects of subsequent processing steps encountered during the integrated circuit fabrication process. Substrate 30 can be a homogeneous conductive material such as single crystal silicon or a composite structure such as epitaxial silicon formed over a single crystal silicon substrate. A masking layer 36 of oxidation resistant material, for example silicon nitride, having a top surface 37, is formed to overlie insulating layer 32.

Using conventional photolithographic techniques and anisotropic reactive ion etching, layer 36 is patterned and etched to form an opening 38 in layer 36, exposing a portion of layer 32 overlying non-active region 31. An anisotropic etch is an etch that proceeds much more rapidly in a vertical direction than in a horizontal direction, thus tending to produce a patterned layer with near vertical edges. Opening 38 thus formed is bounded by a substantially vertical surface 40, which extends from top surface 35 to top surface 37. Opening 38 is formed to overlie non-active region 31 of substrate 30.

Figure 3:
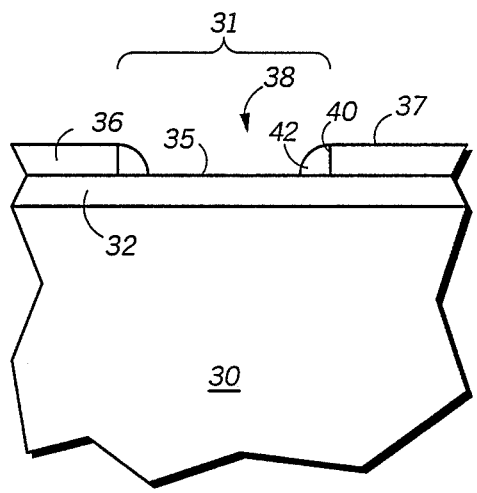

The process continues, in a preferred embodiment, by forming a sidewall spacer 42 overlying the vertical surface 40. Sidewall spacer 42 covers an edge portion of non-active region 31, as shown in FIG. 3. Sidewall spacer 42 is formed by first depositing a layer of conformal material over layer 36 and extending into opening 38. The spacer is formed from a material such as a low temperature silicon dioxide, to a thickness of 200 to 800 nanometers by chemical vapor deposition or other means. The spacer forming material is then anisotropically etched from top surface 37 leaving a portion of this material on the vertical surface 40. A high selectivity plasma etch is employed in which the etch gasses are chosen such that the conformal material etches much more rapidly than masking layer 36. The sidewall spacer 42 thus formed will be used to protect an edge portion of isolation region 31 during formation of the trench.

Figure 4:
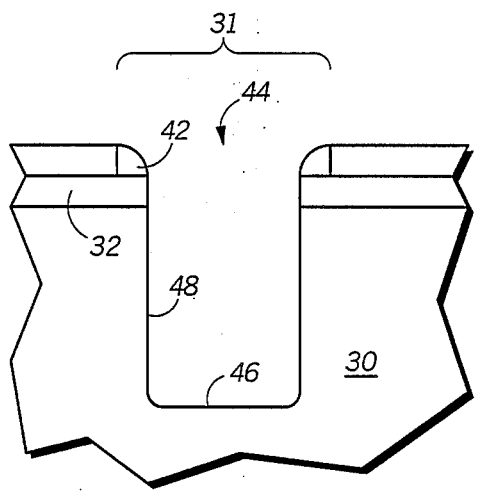

In accordance with the invention, the process proceeds with the removal, by means of an anisotropic etch, of exposed portions of insulation layer 32 using the sidewall spacer 42 as an etch mask. After etching layer 32, a trench 44 is formed in substrate 30 by anisotropically etching substrate 30 using sidewall spacer 42 as an etch mask, as illustrated in FIG. 4. The trench 44 has bottom surface 46 and a wall surface 48 extending from the sidewall spacer 42 to the bottom surface 46.

Trench 44 is then thermally oxidized to form a passivation layer 50 on the wall surface and the bottom surface of the trench. Alternatively, a passivation layer may be formed by deposition of a dielectric material such as a low temperature silicon dioxide. The passivation layer, having a thickness of 20 to 100 nanometers, provides electrical isolation between the surrounding substrate and any conductive materials used to fill the trench. A thin layer of seed material 51 is then conformably deposited to overlie the wall surface and the bottom surface of the trench, as shown in FIG. 5. A seed material is a material that is conformably deposited on the surface of a semiconductor device and provides a nucleation site for a subsequent selective deposition of a second material. In a controlled process environment, when compounds that are of similar chemical composition to that of the seed material, or are highly reactive with the seed material, are introduced, deposition will preferentially occur at the nucleation sites provided by the seed material. Under these conditions, the material does not deposit in the absence of the seed material. For example, it is known in the art that selective deposition of tungsten is preferentially obtained on areas where polysilicon has been previously deposited. Additionally, it is also known in the art that silicon will preferentially deposit on areas where polysilicon has been previously deposited. Alternatively, other materials can be used to provide a seed layer such as tungsten, or the like. In one embodiment of the invention, the seed material is deposited, by chemical vapor deposition, to a thickness of 20 to 200 nanometers.

After deposition of seed material 51, an anisotropic etch is performed to remove excess seed material from the top surface 37 leaving a portion of seed material 52 on the wall surface of the trench, as shown in FIG. 6. The removal of the seed material from the bottom of the trench is not required.

In accordance with the invention, the volume of the trench is filled by the selective deposition of a trench fill material 54 such as polysilicon, tungsten, titanium or other selectively depositable material. In one embodiment, the deposition takes place in the trench and is propagated by seed material 52 on the wall of the trench. As illustrated in FIG. 7, the selective deposition fills the trench but does not deposit any material on the dissimilar material of masking layer 36, sidewall spacer 42, or the remaining exposed upper portion of passivation layer 50. The absence of excess trench fill material outside the trench or above the original plane of substrate 30 eliminates the need to etch back excess material to form a smooth surface. This method stands in contrast to the prior art in which the trench is filled with a non-selectively deposited material and subsequently etched back. The absence of an etch back step, as taught by the preferred embodiment of the present invention, results in a more uniform topography over the semiconductor device.

Alternatively, the trench can be filled with a dielectric material using a standard deposition process. In this case the dielectric material will be etched back to remove excess material from surface 37.

After filling the trench by selective deposition, the sidewall spacer 42 is removed by means of an isotropic etch. Herein an isotropic etch is an etch that proceeds in all directions at the same rate. The sidewall spacer is etched, for example, by high selectivity isotropic plasma etching in an etchant which etches the sidewall spacer material at a much greater rate than it etches the mask layer 36 and the trench fill material 54. This etch opens an exposed area 56 around the perimeter of the filled trench, as shown in FIG. 8. As illustrated in FIG. 8 the inventive process has resulted in the trench being aligned to the center portion of non-active region 31. If passivation layer 50 was formed using a deposition process, the remaining passivation material overlying masking layer 36 would also be removed by the isotropic etch.

At this point a channel stop layer can be formed by introducing a dopant in exposed area 56 of non-active region 31 using masking layer 36 as a dopant mask. The use of masking layer 36 as a dopant mask, will self-align the channel stop layer to the exposed substrate area 56 surrounding the trench. The dopant may be introduced, by ion implantation or other means. The self-aligned channel stop layer thus formed will further electrically isolate the trench structure 44 formed in non-active region 31 from the surrounding active substrate region.

Figure 9:
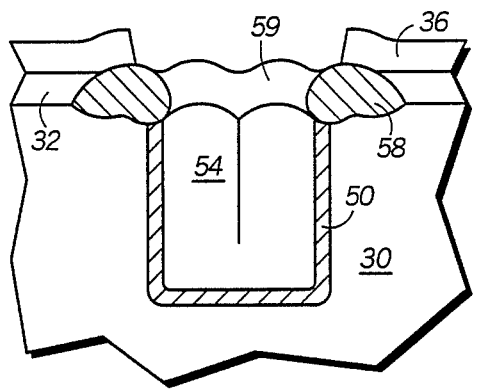

After removing the sidewall spacer and formation of a channel stop layer, the exposed area 56 is thermally oxidized to form a silicon dioxide electrical insulation region 58 surrounding the trench. As illustrated in FIG. 9, the oxidation proceeds in a manner such that the edges of masking layer 36 are displaced from the underlying layers forming a distal point from the trench, the well known "bird's beak" encroachment of the silicon dioxide. Although the oxidation process of the present invention shares similar characteristics with a conventional localized oxidation of silicon (LOCOS) process, a substantially lesser amount of substrate oxidation is required to form the insulation region 58 shown in FIG. 9. The embodiment illustrated in FIG. 9 features insulation region 58 formed to a thickness of about 300 nanometers. In contrast, a typical LOCOS oxidation results in an oxidation of a silicon substrate to a thickness range of 700 to 1000 nanometers. The reduced oxidation requirement of the invention arise from the need to only enhance the isolation characteristics of the trench. In a conventional LOCOS oxidation process all of the isolation requirements must be provided by this oxidation creating a need for a much more extensive oxidation of substrate 30.

The oxidation process forming insulation region 58 also results in the formation of an oxide layer 59 over the conductive material filling the trench. The formation of oxide layer 59 is advantageous in providing a smoother more continuous surface over the isolation region.

The trench structure is then finished by the removal of masking layer 36 using a selective isotropic etch. The etchant used to remove mask layer 36 is selected to etch the mask layer material, in this case silicon nitride, at a much greater rate than the underlaying insulating layer 32 and the trench fill material 54. After the removal of the masking layer, the insulation layer is removed by conventional processes normally encountered in the integrated circuit manufacturing process or the insulating layer may be allowed to remain in place during further processing to protect the substrate from contamination. Subsequently, highly doped regions 60 and 62 are created in substrate 30, by ion implantation or other means, using the trench isolation structure as a mask. Regions 60 and 62 form, for example, the source and drain of adjacent transistors. The resulting structure is shown in FIG. 10.

The structure formed in accordance with the invention has the advantage of being self-aligned to nonactive region 31 of substrate 30. The self-alignment positions the trench structure centrally between the highly doped regions associated with adjacent transistors without the need for a critically aligned photomask. The displacement of the isolation trench structure away from the highly doped regions reduces the side channel leakage and the stray parasitic capacitance between these regions and the conductive material filling the trench. The structure thus formed has the further advantage of a more smooth surface topography over the trench isolation structure enabling the formation of defect free transistor gate interconnects.

Figure 10:
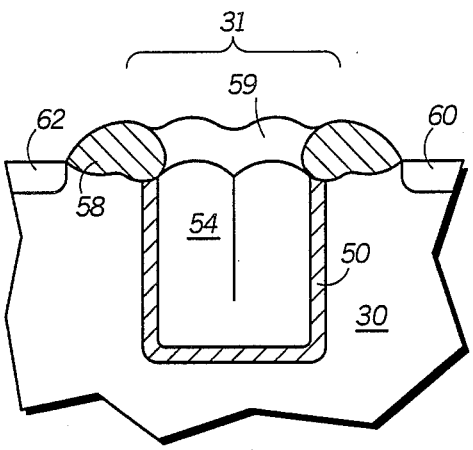

In one embodiment the trench structure shown in FIG. 10 may be used as an isolation structure to electrically isolate regions 60 and 62 from each other.

Figure 11:
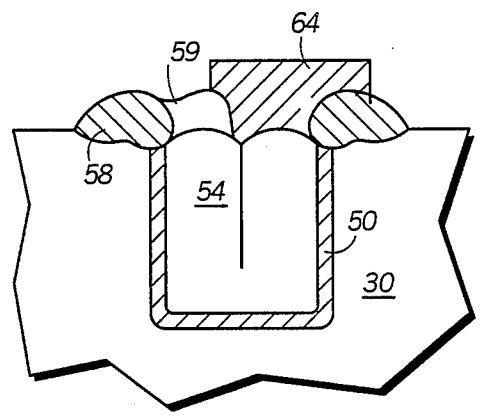
FIG. 11 illustrates, in cross section, one embodiment of the invention as a trench capacitor.

In another embodiment, the trench structure may be used as a capacitor by filling the trench with a conductive material and forming a contact to the conductive material filling the trench. The conductive material filling the trench and substrate 30 comprise the two plates of the capacitor which are separated by passivation layer 50. In a capacitor application, passivation layer 50 serves as a capacitor dielectric. As shown in FIG. 11, oxide layer 59 is patterned and etched to form an opening in the oxide layer and exposing a top portion of trench fill material 54. A layer of conductive material is formed to overlie substrate 30, then patterned to form a contact lead to trench fill material 54.

In yet another embodiment (not illustrated), a silicon substrate is provided and a thick insulation layer is formed overlying the silicon substrate. Trench structure 44 is then formed, by anisotropic etching, in the layer of insulating material. The trench, thus formed, is completely surrounded by the insulating material. The process continues by filling the trench using the previously described seeding and selective deposition technique.

Thus it is apparent that there has been provided, in accordance with the invention, a method for fabricating a trench structure which fully meet the objects and advantages set forth above. Although the process has been described and illustrated with reference to specific illustrative embodiments thereof, it is not intended that the invention be limited to those illustrative embodiments. Those skilled in the art will recognize that variations and modifications can be made without departing from the spirit of the invention. For example, various materials can be used to from a passivation layer such as an oxide-nitride-oxide (ONO) composite layer. It is therefore intended to include within the invention all such variations and modifications as fall within the scope of the appended claims.

We claim:

1. A method for fabricating an integrated circuit trench structure, comprising the steps of:
   providing a substrate having a surface;
   forming a masking layer over said substrate surface;
   forming an opening in said masking layer overlying said substrate surface, said opening bounded by a vertical surface and exposing a portion of said substrate surface;
   forming a sidewall spacer on said vertical surface, said sidewall spacer covering an edge portion of said exposed substrate surface and leaving exposed a central portion of said exposed substrate surface;
   etching a trench in said exposed central portion of said exposed substrate surface, using said sidewall spacer as an etch mask, said trench having a wall surface and a bottom surface, said wall surface being self-aligned with said sidewall spacers;
   depositing a material into and substantially filling said trench;
   removing said sidewall spacers to expose said edge portion of said exposed substrate surface;
   thermally oxidizing said edge portion to form an insulating region overlying said edge portion of said exposed substrate surface and surrounding said central portion of said exposed substrate surface; and
   removing said masking layer.

2. The method of claim 1 further comprising the steps of;
   forming a channel stop layer in said exposed substrate; and
   forming a passivation layer overlying said trench wall surface and said trench bottom surface.

3. The method of claim 2 wherein said step of depositing comprises the steps of:
   forming a layer of a first material on said passivation layer; and
   selectively depositing a layer of a second material into and substantially filling said trench using said layer of first material as a nucleation site for said selective deposition therein.

4. The method of claim 3 wherein said step of forming a layer of a first material comprises the steps of:
   conformably depositing a first layer of conductive material to overlie said passivation layer, said first layer of conductive material being differentially etchable with respect to said passivation layer; and
   anisotropically etching said first layer of conductive material to leave a portion of said first layer on said passivation layer.

5. The method of claim 4 wherein said conductive material is selected from the group consisting of polycrystalline silicon, tungsten, platinum, cobalt, and titanium.

6. The method of claim 3 wherein said first material is selected from the group consisting of polycrystalline silicon, tungsten, platinum, cobalt, and titanium.

7. The method of claim 3 wherein said second material is selected from the group consisting of polycrystalline silicon, tungsten, platinum, cobalt, and titanium.

8. The method of claim 2 wherein said step of providing a substrate and said step of forming a masking layer comprises the steps of:
   providing a single crystal silicon substrate
   oxidizing said single crystal silicon substrate to form a thin layer of silicon dioxide overlying said substrate; and
   depositing a layer of silicon nitride to overlie said thin layer.

9. The method of claim 2 wherein said step of providing a substrate comprises the steps of:
   providing a single crystal silicon substrate; and
   depositing a layer of epitaxial silicon to overlie said single crystal silicon substrate.

10. The method of claim 2 wherein said step of forming a passivation layer comprises the step of depositing a dielectric material.

11. The method of claim 2 wherein said step of forming a passivation layer comprises the step of thermally oxidizing silicon to from a layer of silicon dioxide.

12. The method of claim 1 wherein said step of depositing comprises the steps of:
   forming a layer of a first material on said trench wall surface; and
   selectively depositing a layer of a second material into and substantially filling said trench using said layer of first material as a nucleation site for said selective deposition therein.

13. The method of claim 12 wherein said step of forming a layer of a first material comprises the steps of:
   conformably depositing a first layer of conductive material to overlie said trench wall surface, said first layer of conductive material being differentially etchable with respect to said trench wall surface and said trench bottom surface; and
   anisotropically etching said first layer of conductive material to leave a portion of said first layer on said trench wall.

14. The method of claim 13 wherein said conductive material is selected from the group consisting of polycrystalline silicon, tungsten, platinum, cobalt, and titanium.

15. The method of claim 12 wherein said first material is selected from the group consisting of polycrystalline silicon, tungsten, platinum, cobalt, and titanium.

16. The method of claim 12 wherein said second material is selected from the group consisting of polycrystalline silicon, tungsten, platinum, cobalt, and titanium.

17. The method of claim 1 wherein said step of depositing a material comprises depositing a dielectric material.

18. The method of claim 1 wherein said step of providing a substrate and said step of forming a masking layer comprises the steps of:
   providing a single crystal silicon substrate
   oxidizing said single crystal silicon substrate to form a thin layer of silicon dioxide overlying said substrate; and
   depositing a layer of silicon nitride to overlie said thin layer.

19. The method of claim 1 wherein said step of providing a substrate comprises the steps of:
   providing a single crystal silicon substrate; and
   depositing a layer of epitaxial silicon to overlie said single crystal silicon substrate.

* * * * *